United States Patent
Dordi et al.

(10) Patent No.: US 11,424,158 B2
(45) Date of Patent: *Aug. 23, 2022

(54) METAL LINER PASSIVATION AND ADHESION ENHANCEMENT BY ZINC DOPING

(71) Applicant: Lam Research Corporation, Fremont, CA (US)

(72) Inventors: Yezdi N. Dordi, Palo Alto, CA (US); Aniruddha Joi, San Jose, CA (US); Steven James Madsen, Mountain View, CA (US); Dries Dictus, Villach (AT)

(73) Assignee: LAM RESEARCH CORPORATION, Fremont, CA (US)

( * ) Notice: Subject to any disclaimer, the term of this patent is extended or adjusted under 35 U.S.C. 154(b) by 84 days.

This patent is subject to a terminal disclaimer.

(21) Appl. No.: 16/984,882

(22) Filed: Aug. 4, 2020

(65) Prior Publication Data

US 2020/0365453 A1  Nov. 19, 2020

Related U.S. Application Data

(63) Continuation of application No. 16/000,457, filed on Jun. 5, 2018, now Pat. No. 10,741,440.

(51) Int. Cl.
*H01L 21/768* (2006.01)
*H01L 21/285* (2006.01)
(Continued)

(52) U.S. Cl.
CPC .. *H01L 21/76832* (2013.01); *H01L 21/28556* (2013.01); *H01L 21/3212* (2013.01);
(Continued)

(58) Field of Classification Search
CPC ......... H01L 21/76832; H01L 21/28556; H01L 21/3212; H01L 21/6723; H01L 21/762;
(Continued)

(56) References Cited

U.S. PATENT DOCUMENTS

| | | | |
|---|---|---|---|
| 2009/0321935 A1 | 12/2009 | O'Brien et al. | |
| 2012/0141667 A1* | 6/2012 | Kim | C23C 16/06 427/123 |

(Continued)

OTHER PUBLICATIONS

International Search Report and Written Opinion for PCT Application No. PCT/US2019/033710 dated Sep. 11, 2019.

*Primary Examiner* — Karen Kusumakar
*Assistant Examiner* — Adam S Bowen

(57) ABSTRACT

A method comprises depositing a barrier layer on a dielectric layer to prevent oxidation of a metal layer to be deposited by electroplating due to an oxide present in the dielectric layer and depositing a doped liner layer on the barrier layer to bond with the metal layer to be deposited on the liner layer by the electroplating. The dopant forms a protective passivation layer on a surface of the liner layer and dissolves during the electroplating so that the metal layer deposited on the liner layer by the electroplating bonds with the liner layer. The dopant reacts with the dielectric layer and forms a layer of a compound between the barrier layer and the dielectric layer. The compound layer prevents oxidation of the barrier layer and the liner layer due to the oxide present in the dielectric layer and adheres the barrier layer to the dielectric layer.

32 Claims, 11 Drawing Sheets

(51) Int. Cl.
  *H01L 21/67* (2006.01)
  *H01L 21/762* (2006.01)
  *H01L 21/321* (2006.01)
  *C25D 3/12* (2006.01)
  *C25D 3/38* (2006.01)

(52) U.S. Cl.
  CPC ........ *H01L 21/6723* (2013.01); *H01L 21/762* (2013.01); *H01L 21/76864* (2013.01); *C25D 3/12* (2013.01); *C25D 3/38* (2013.01); *H01L 21/76873* (2013.01)

(58) Field of Classification Search
  CPC ......... H01L 21/76864; H01L 21/76873; H01L 21/76843; H01L 21/76861; H01L 23/53238; H01L 21/02164; H01L 21/02271; H01L 21/0257; H01L 21/28194; H01L 21/76846; H01L 21/7685; H01L 21/76871; H01L 2924/0103; C25D 3/12; C25D 3/38; C25D 17/02; C25D 21/06; C25D 21/14; C25D 5/48; C25D 7/123; C25D 17/00; C25D 17/001
  See application file for complete search history.

(56) References Cited

U.S. PATENT DOCUMENTS

| | | |
|---|---|---|
| 2012/0315756 A1 | 12/2012 | Weidman et al. |
| 2013/0113102 A1* | 5/2013 | Bao ................ H01L 21/76873 257/751 |
| 2014/0332961 A1 | 11/2014 | Lee et al. |
| 2016/0133513 A1 | 5/2016 | Hegde et al. |
| 2017/0092589 A1 | 3/2017 | Chen et al. |

* cited by examiner

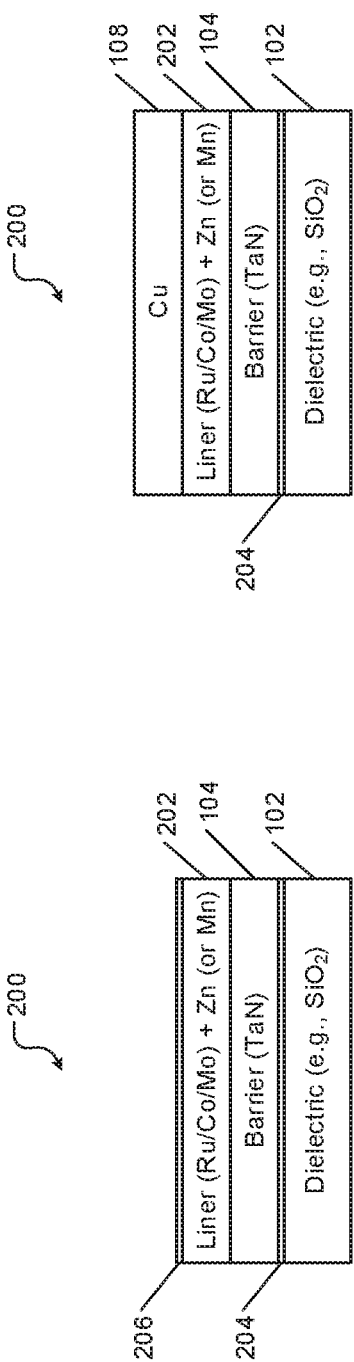

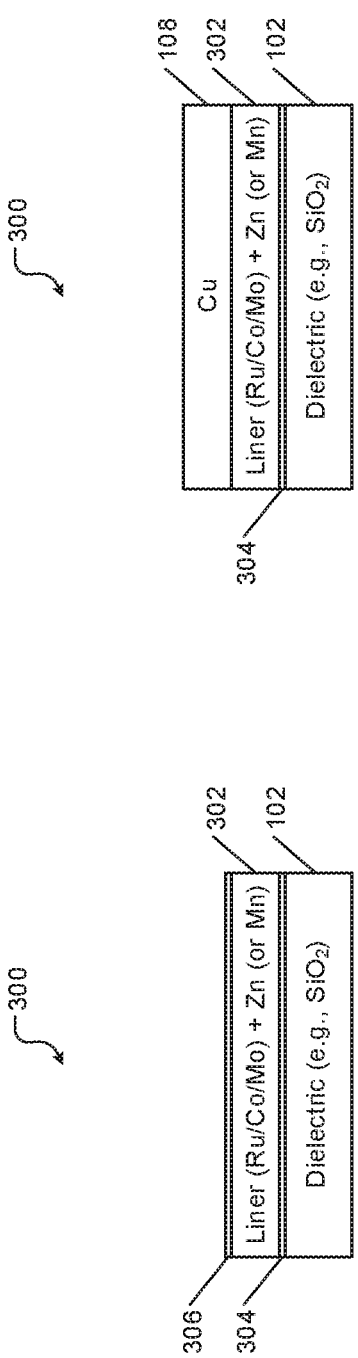

METAL LINER PASSIVATION AND ADHESION ENHANCEMENT BY ZINC DOPING

CROSS-REFERENCE TO RELATED APPLICATIONS

The present disclosure is a continuation of U.S. patent application Ser. No. 16/000,457, filed on Jun. 5, 2018. The entire disclosure of the application referenced above is incorporated herein by reference.

FIELD

The present disclosure relates generally to electroplating substrates and more specifically to electroplating substrates equipped with metal liner passivation and adhesion enhancement provided by zinc doping.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electrochemical deposition (ECD), also called plating or electroplating, is used to deposit metals onto substrates. For example, ECD is used to deposit metals on interconnect structures in an IC package. Examples of the interconnect structures include bumps, pillars, through silicon vias (TSVs), and redistribution layers (RDLs). ECD is also used in multichip packaging and interconnection processes generally called wafer level packaging (WLP).

SUMMARY

A method comprises depositing a barrier layer on a dielectric layer to prevent oxidation of a metal layer to be deposited by electroplating due to an oxide present in the dielectric layer. The method further comprises depositing a liner layer on the barrier layer to bond with the metal layer to be deposited on the liner layer by the electroplating. The liner layer is doped with a dopant. The dopant forms a passivation layer on a surface of the liner layer on which the metal layer is to be deposited when the surface is exposed to air prior to the electroplating. The passivation layer prevents further oxidation of the liner layer when the liner layer is exposed to air prior to the electroplating. The passivation layer dissolves during the electroplating so that the metal layer deposited on the liner layer by the electroplating bonds with the liner layer. The dopant reacts with the dielectric layer and forms a layer of a compound between the barrier layer and the dielectric layer. The layer of the compound prevents oxidation of the barrier layer and the liner layer due to the oxide present in the dielectric layer. The layer of the compound adheres the barrier layer to the dielectric layer.

In other features, the method further comprises electroplating the metal layer on the liner layer and performing chemical mechanical planarization on the metal layer.

In other features, the method further comprises performing chemical mechanical planarization on the metal layer.

In other features, the dopant includes a more electronegative element than elements used to form the liner layer and the metal layer.

In other features, the method further comprises co-depositing the liner layer and the dopant on the barrier layer.

In other features, the method further comprises depositing the dopant on the liner layer.

In other features, the dielectric layer includes a material having a low dielectric constant, the compound includes a substance formed by a combination of the material and the dopant, and the passivation layer includes an oxide of the dopant.

In other features, the dielectric layer includes $SiO_2$, the compound includes a substance formed by a combination of $SiO_2$ and the dopant, and the passivation layer includes an oxide of the dopant.

In other features, the method further comprises forming the barrier layer using TaN; forming the liner layer using Ru, Co, or Mo; doping the liner layer using Zn, Mn, In, Sn, or Al; and forming the metal layer using Cu.

In other features, the method further comprises performing a heat treatment on the liner layer, the barrier layer, and the dielectric layer prior to the electroplating.

In still other features, a method comprises providing a dielectric layer and depositing a liner layer on the dielectric layer to bond with a metal layer to be deposited on the liner layer by electroplating. The liner layer is doped with a dopant. The dopant forms a passivation layer on a surface of the liner layer on which the metal layer is to be deposited when the liner layer is exposed to air prior to the electroplating. The passivation layer prevents further oxidation of the liner layer due to exposure to air prior to the electroplating. The passivation layer dissolves during the electroplating so that the metal layer deposited on the liner layer by the electroplating bonds with the liner layer. The dopant reacts with the dielectric layer and forms a layer of a compound between the liner layer and the dielectric layer. The layer of the compound prevents oxidation of the liner layer and the metal layer due to an oxide present in the dielectric layer. The layer of the compound adheres the liner layer to the dielectric layer.

In other features, the method further comprises electroplating the metal layer on the liner layer and performing chemical mechanical planarization on the metal layer.

In other features, the method further comprises performing chemical mechanical planarization on the metal layer.

In other features, the dopant includes a more electronegative element than elements used to form the liner layer and the metal layer.

In other features, the method further comprises co-depositing the liner layer and the dopant on the dielectric layer.

In other features, the method further comprises depositing the dopant on the liner layer.

In other features, the dielectric layer includes a material having a low dielectric constant, the compound includes a substance formed by a combination of the material and the dopant, and the passivation layer includes an oxide of the dopant.

In other features, the dielectric layer includes $SiO_2$, the compound includes a substance formed by a combination of $SiO_2$ and the dopant, and the passivation layer includes an oxide of the dopant.

In other features, the method further comprises forming the liner layer using Ru, Co, or Mo; doping the liner layer using Zn, Mn, In, Sn, or Al; and forming the metal layer using Cu.

In other features, the method further comprises performing a heat treatment on the liner layer and the dielectric layer prior to the electroplating.

In still other features, a substrate processing system comprises a chamber for processing a semiconductor substrate and a substrate support arranged in the chamber to support the semiconductor substrate during the processing. The substrate processing system further comprises a controller coupled to the chamber. The controller is configured to deposit a barrier layer on the semiconductor substrate to prevent oxidation of a metal layer to be deposited by electroplating due to an oxide present in the semiconductor substrate. The controller is configured to deposit a liner layer on the barrier layer to bond with the metal layer to be deposited on the liner layer by the electroplating. The liner layer is doped with a dopant. The dopant forms a passivation layer on a surface of the liner layer on which the metal layer is to be deposited when the surface is exposed to air prior to the electroplating. The passivation layer prevents further oxidation of the liner layer when the liner layer is exposed to air prior to the electroplating. The passivation layer dissolves during the electroplating so that the metal layer deposited on the liner layer by the electroplating bonds with the liner layer. The dopant reacts with the semiconductor substrate and forms a layer of a compound between the barrier layer and the semiconductor substrate. The layer of the compound prevents oxidation of the barrier layer and the liner layer due to the oxide present in the semiconductor substrate. The layer of the compound adheres the barrier layer to the semiconductor substrate.

In other features, the dopant includes a more electronegative element than elements used to form the liner layer and the metal layer.

In other features, the controller is configured to co-deposit the liner layer and the dopant on the barrier layer.

In other features, the controller is configured to deposit the dopant on the liner layer.

In other features, the semiconductor substrate includes a material having a low dielectric constant, the compound includes a substance formed by a combination of the material and the dopant, and the passivation layer includes an oxide of the dopant.

In other features, the semiconductor substrate includes $SiO_2$, the compound includes a substance formed by a combination of $SiO_2$ and the dopant, and the passivation layer includes an oxide of the dopant.

In other features, the liner layer includes Ru, Co, or Mo; the dopant includes Zn, Mn, In, Sn, or Al; the barrier layer includes TaN; and the metal layer includes Cu.

In still other features, a substrate processing system comprises a chamber for processing a semiconductor substrate and a substrate support arranged in the chamber to support the semiconductor substrate during the processing. The substrate processing system further comprises a controller coupled to the chamber. The controller is configured to deposit a liner layer on the semiconductor substrate to bond with a metal layer to be deposited on the liner layer by electroplating. The liner layer is doped with a dopant. The dopant forms a passivation layer on a surface of the liner layer on which the metal layer is to be deposited when the liner layer is exposed to air prior to the electroplating. The passivation layer prevents further oxidation of the liner layer due to exposure to air prior to the electroplating. The passivation layer dissolves during the electroplating so that the metal layer deposited on the liner layer by the electroplating bonds with the liner layer. The dopant reacts with the semiconductor substrate and forms a layer of a compound between the liner layer and the semiconductor substrate. The layer of the compound prevents oxidation of the liner layer and the metal layer deposited on the liner layer due to an oxide present in the semiconductor substrate. The layer of the compound adheres the liner layer to the semiconductor substrate.

In other features, the dopant includes a more electronegative element than elements used to form the liner layer and the metal layer.

In other features, the controller is configured to co-deposit the liner layer and the dopant on the semiconductor substrate.

In other features, the controller is configured to deposit the dopant on the liner layer.

In other features, the semiconductor substrate includes a material having a low dielectric constant, the compound includes a substance formed by a combination of the material and the dopant, and the passivation layer includes an oxide of the dopant.

In other features, the semiconductor substrate includes $SiO_2$, the compound includes a substance formed by a combination of $SiO_2$ and the dopant, and the passivation layer includes an oxide of the dopant.

In other features, the liner layer includes Ru, Co, or Mo; the dopant includes Zn, Mn, In, Sn, or Al; and the metal layer includes Cu.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2A-2F show an example of a component including a doped liner layer and a barrier layer deposited on a substrate that can be electroplated with a metal layer;

FIGS. 3A-3F show an example of a component including a doped liner layer and no barrier layer deposited on a substrate that can be electroplated with a metal layer;

In the drawings, reference numbers may be reused to identify similar and/or identical elements.

DETAILED DESCRIPTION

Figure 1B:
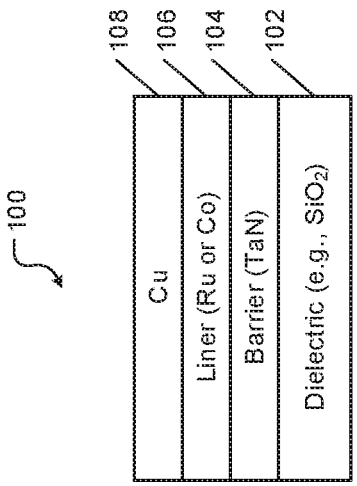
FIGS. 1A and 1B show an example of a component including an un-doped liner layer and a barrier layer deposited on a substrate that can be electroplated with a metal layer.

Throughout the present disclosure, the following elements and symbols are used: Copper (Cu), Ruthenium (Ru), Cobalt (Co), Molybdenum (Mo), Zinc (Zn), Manganese (Mn), Indium (In), Stannum or Tin (Sn), Aluminum (Al), Silicon (Si), Tantalum (Ta), Oxygen (O), and Nitrogen (N).

The present disclosure relates to an electrochemical technique of doping liner materials (e.g., Ru, Co, or Mo) used in electroplating substrates, where a substrate can include a material having a low dielectric constant (low-k material or dielectric; e.g., $SiO_2$). The liner materials are doped with an electronegative element X (e.g., Zn, Mn, In, Sn, or Al) that is more electronegative than the liner material and the metal (e.g., Cu) to be deposited on the liner material by electroplating. The doping element X provides a two-fold benefit as follows.

First, the doping element can be driven to an interface between the liner and the substrate (dielectric) using a suitable heat treatment process (e.g., annealing may be used although some migration of the doping element from the liner to the dielectric is observed at room temperature). The doping element reacts with the dielectric material to form a layer of a compound between the liner metal (e.g., Ru, Co, or Mo) layer and the substrate (i.e., the dielectric layer). The compound includes a substance formed by a combination of the dielectric material and the dopant. For example, if the dielectric material includes $SiO_2$, the compound may be of the form $XSi_yO_z$, which can include a silicate, a silicide, or an oxide of the doping element X. If a low-k dielectric material other than $SiO_2$ is used as a substrate, the compound can include a nitride or carbide as well. The layer of the compound formed between the liner metal (e.g., Ru, Co, or Mo) layer and the dielectric layer provides adhesion. Second, upon exposure to air, the doping element reacts with oxygen in the air and forms a sacrificial passivation layer on the liner material. The passivation layer protects the liner material, specifically Co, which has high affinity for oxygen, from queue time dependent oxidation.

Further, this technique enables a barrier-less metallization scheme providing superior adhesion and barrier properties for the future technology nodes. In addition, this technique prevents liner (and barrier) oxidation through the formation of the passivation layer. This is advantageous not only from an integration perspective but also from a reliability perspective, where barrier oxidation through extremely thin liner can degrade reliability. Accordingly, this technique obviates the need to store substrates in an expensive vacuum environment, which is otherwise necessary to prevent liner (and barrier) oxidation while the substrates wait in queue prior to electroplating.

In fabrication of advanced semiconductor devices, Cu is widely used as an interconnect material. Currently, Cu metallization schemes include depositing a Ru or Co liner on top of a TaN barrier stacked on a dielectric substrate. Cu is then deposited on the liner by electroplating. The TaN layer serves a barrier layer to prevent Cu from diffusing through the liner into the dielectric layer, and the Ru or Co layer acts as a liner to enable Cu deposition by providing lower electrical resistance than TaN.

With continually shrinking size of the technology nodes, the barrier/liner layers need to be scaled to maximize Cu cross-section area. In future technology nodes, the Co (or Ru) liner will be in the order of 1-2 nm thick. At this thickness, barrier oxidation by oxygen diffusion through the liner can be problematic. For example, oxidation of TaN barrier through a 5 nm Co liner (formed by PVD) can occur in about four hours of air-break (a typical queue time in semiconductor fabrication systems). This barrier oxidation is detrimental for interconnect reliability.

The present disclosure addresses the barrier oxidation problem by introducing a doping element in the liner layer. This approach involves introducing Zn (or Mn, In, Sn, or Al) dopant in the liner material (Co or Ru). Upon exposure to air, Zn (or Mn, In, Sn, or Al) diffuses to the air interface due to the dopant's high electronegativity and the dopant's diffusivity and forms a passivating oxide film on the liner material. This passivating oxide film prevents oxygen diffusion through the liner material and protects the barrier layer from oxidation.

Additionally, this passivating oxide film preserves the metallic nature of the liner, which benefits in the subsequent electroplating step where a pre-clean step is typically performed prior to plating in order to reduce the native metal oxide. Notably, since Co has high affinity for oxygen, CoO reduction is not trivial.

Further, this doping technique can also enable a barrier-less metallization approach. Specifically, in the barrier-less metallization approach, the doped liner can be directly deposited on the dielectric substrate. The direct deposition of the doped liner on the dielectric substrate can serve a two-fold purpose. First, Zn (or Mn, In, Sn, or Al) in the liner can chemically react with the dielectric material to form an adhesion layer. In the absence of a TaN barrier layer, this adhesion layer can additionally provide barrier properties and can be useful during chemical mechanical planarization (CMP or simply polishing). Second, Zn (or Mn, In, Sn, or Al) can passivate the liner as described above.

Accordingly, the present disclosure relates to doping an electronegative element directly onto the liner material (Ru, Co). The doping can be achieved by co-deposition performed using atomic layer deposition (ALD) during the liner deposition process or by an electrochemical (wet) process after liner deposition. The doping element (i.e., dopant) provides protection against liner and barrier oxidation. Further, the formation of a Zn (or Mn, In, Sn, or Al) based adhesion layer can enable barrier-less metallization for future technology nodes. These and other features of the present disclosure are described below in detail.

The present disclosure is organized as follows. Initially, an overview of the present disclosure is presented. Thereafter, an example of a structure (component) including an un-doped liner layer and a barrier layer is described with reference to FIGS. 1A-1B. Subsequently, an example of a structure including a doped liner layer and a barrier layer is described with reference to FIGS. 2A-2F. Thereafter, an example of a structure including a doped liner layer and no barrier layer is described with reference to FIGS. 3A-3F. Methods of forming structures with doped liner layers and with a barrier layer or with no barrier layer are described with reference to FIGS. 4A-4B. An example of a substrate processing system comprising a plurality of process modules that can be used to form the various structures of the present disclosure is described with reference to FIG. 5. An example of a deposition chamber that can be used to deposit the various liner and barrier layers of the present disclosure is described with reference to FIG. 6. An example of an electroplating system that can be used to electroplate a metal layer on the various structures of the present disclosure is described with reference to FIG. 7.

Briefly, according to the present disclosure, a Co, Ru, or Mo liner can be doped with Zn (or Mn, In, Sn, or Al) using a wet or dry process. Zn prevents oxidation of Co liner and allows the Co liner to be compatible with electroplating by preserving electrical properties of the Co liner. Zn oxidizes, passivates the liner with a layer of ZnO, and prevents the metal of interest (i.e., the liner) from oxidizing further.

During electroplating, the ZnO passivation layer formed on the liner dissolves in the electrolytes used, and the electroplating metal (Cu) forms a strong, low resistance metal-to-metal bond with the liner as compared to a weak bond that would otherwise form if Co is oxidized in the absence of Zn.

Zn also diffuses through the liner and reacts with the dielectric material in the substrate to form a layer of a compound between the liner and the dielectric. The compound layer serves two purposes. First, the compound layer improves the adhesion between the liner and the dielectric layer; and second, the compound layer prevents ions of Cu (deposited by electroplating) from drifting into the dielectric layer. That is, the compound layer performs the function of a barrier layer and eliminates the need for depositing an explicit barrier layer such as TaN on the dielectric layer. Eliminating an explicit barrier layer by doping the liner and depositing the doped liner directly on the dielectric layer provides a barrier-less method for electroplating, which is advantageous as the size of the process nodes continues to shrink.

The purpose of a barrier layer is to prevent oxidation of the metal deposited by electroplating (e.g., Cu) on the dielectric layer. Typically, without a barrier layer, Cu oxidizes at the Cu-dielectric interface. When bias is applied, Cu ions drift into the dielectric layer causing a leakage current. To prevent this, a barrier layer (e.g., TaN) is typically added between Cu and the dielectric layer to prevent Cu from oxidizing at the Cu-dielectric interface and causing leakage current when bias is applied.

Such barrier layers, however, are electrically resistive and also occupy space, which is a problem as the size of the process nodes continues to shrink with advances in technology. Instead, if the liner is doped with an electronegative element such as Zn (or Mn, In, Sn, or Al), the doping element provides protection on both sides of the liner. On the liner-metal interface side, the doping element provides galvanic protection to (i.e., prevents oxidation of) the liner by forming a sacrificial passivation layer on the liner. Additionally, on the liner-dielectric interface, the doping element leaks or migrates (diffuses) through the liner, reacts with the dielectric layer, and forms a layer of a compound that provides adhesion between the liner and the dielectric layer and also eliminates the problem of leakage current.

Further, if an explicit barrier layer is used between the liner and the dielectric layer, the doping element in the liner also protects the barrier layer from oxidation. Specifically, the doping element protects the barrier layer from oxidizing at the barrier-dielectric interface due to the formation of the compound layer. Further, the sacrificial passivating layer formed on the liner prevents oxygen from diffusing through the liner into the barrier layer and oxidizing the barrier layer.

Several doping techniques can be used to dope the liner. For example, a thin layer of Zn (or Mn, In, Sn, or Al) can be deposited on Ru (or Mo) liner. Alternatively, a single layer of a doped liner can be formed by co-depositing a mixture of Ru (or Mo) and Zn (or Mn, In, Sn, or Al). Alternatively, a single layer of a doped liner can be formed by co-depositing a mixture of Co and Zn (or Mn, In, Sn, or Al). Since Co has higher affinity for oxygen than Ru (or Mo), Co may be doped more heavily with Zn (or Mn, In, Sn, or Al) than Ru (or Mo). By lightly doping metals of interest (e.g., Co, Ru, or Mo) in the liner, the metals are made electroplatable on one side of the liner and adherent to the dielectric layer on the other side of the liner (these metals do not otherwise adhere well to the dielectric layer regardless of whether a barrier layer is used). These and other features of the present disclosure are now described below in greater detail.

Figure 1A:
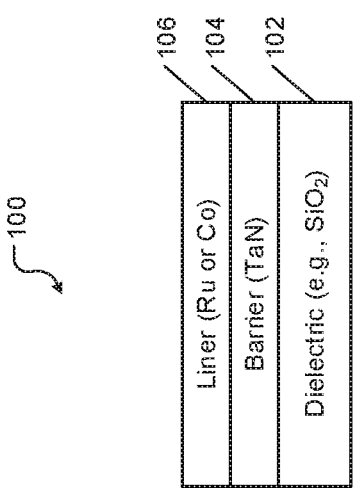

FIGS. 1A and 1B show an example of a structure or a component electroplated without using the doping scheme of the present disclosure. In FIG. 1A, a component 100 to be electroplated comprises a dielectric layer 102, a barrier layer 104, and a liner layer 106. The dielectric layer 102 includes a substrate comprising a low-k dielectric material (e.g., $SiO_2$ substrate). The barrier layer 104 includes a layer of TaN. The liner layer 106 includes a layer of Ru or Co.

The barrier layer 104 is initially deposited on the dielectric layer 102 using a suitable deposition process. Subsequently, the liner layer 106 is deposited on the barrier layer 104 using a suitable deposition process. The stack of the dielectric layer 102, the barrier layer 104, and the liner layer 106 is then subjected to a suitable thermal treatment (e.g., annealing) to form the component 100.

In FIG. 1B, a metal layer (e.g., Cu) 108 is deposited on the liner layer 106 of the component 100 using electroplating. The barrier layer 104 prevents Cu from diffusing through the liner layer 106 into the dielectric layer 102. The liner layer 106 enables Cu deposition by providing lower electrical resistance than the barrier layer 104. However, since the liner layer 106 is not doped with Zn (or Mn, In, Sn, or Al), the liner layer 106 tends to oxidize if the component 100 is exposed to air before electroplating as explained above. Further, as the thickness of the liner layer 106 reduces, the barrier layer 104 becomes prone to oxidation, which is detrimental to interconnect reliability as explained above. To prevent oxidation, the component 100 is stored in expensive vacuum environment while the component 100 waits in queue before electroplating.

FIGS. 2A-2F show a first example of a structure or a component electroplated using the doping scheme of the present disclosure. In the first example, the component also includes a barrier layer.

Figure 2A:
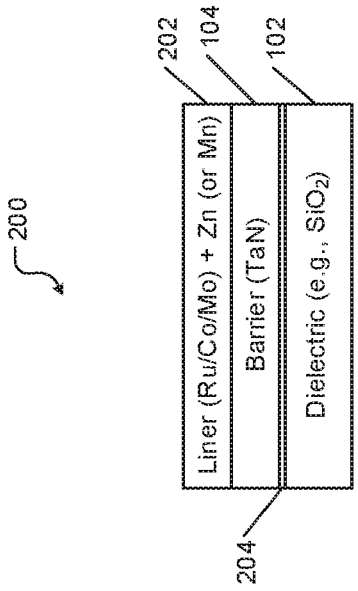

In FIG. 2A, a component 200 to be electroplated comprises the dielectric layer 102, the barrier layer 104, and a liner layer 202. The dielectric layer 102 includes a substrate comprising a low-k dielectric material (e.g., $SiO_2$ substrate). The barrier layer 104 includes a layer of TaN. The liner layer 202 includes a layer of Ru, Co, or Mo doped with Zn (or Mn, In, Sn, or Al).

The barrier layer 104 is initially deposited on the dielectric layer 102 using a suitable deposition process. Subsequently, the liner layer 202 is deposited on the barrier layer 104 using a suitable deposition process (e.g., ALD). The stack of the dielectric layer 102, the barrier layer 104, and the liner layer 202 is then subjected to a suitable thermal treatment (e.g., annealing) to form the component 200.

Figure 2B:
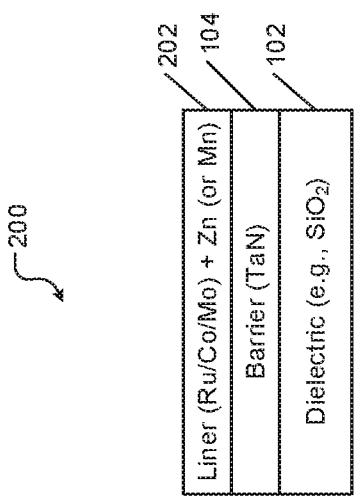

In FIG. 2B, upon annealing or exposure to room temperature, a thin layer of a compound of Zn (or Mn, In, Sn, or Al) and the dielectric material (e.g., a silicate layer if $SiO_2$ is used as the dielectric layer 102) is formed between the dielectric layer 102 and the barrier layer 104. The compound layer is shown at 204. The compound layer 204 prevents oxidation of the barrier layer 104 at the interface of the barrier layer 104 and the dielectric layer 102. The compound layer 204 also provides adhesion for the barrier layer 104 and the liner layer 202 with the dielectric layer 102, which helps during CMP or polishing performed after electroplating.

In FIG. 2C, while the component 200 waits for electroplating and is optionally exposed to air (no vacuum environment is necessary), a thin passivation layer of Zn (or Mn, In, Sn, or Al) oxide (e.g., a passivation or oxide layer 206)

is formed on top of the liner layer 202. The oxide layer 206 protects the liner material from further oxidation due to exposure to air. The oxide layer 206 also prevents oxygen from diffusing through the liner layer 202 into the barrier layer 104 and protects the barrier layer 104 from oxidation.

In FIG. 2D, the metal layer (e.g., Cu) 108 is deposited on the liner layer 202 of the component 200 using electroplating. During electroplating, the oxide layer 206 dissolves in the electrolyte used. The metal layer 108 forms a strong metal-to-metal (Cu—Ru, Cu—Co, or Cu—Mo) bond with the liner layer 202. The barrier layer 104 prevents Cu ions from diffusing through the liner layer 202 into the dielectric layer 102.

Figure 2E:
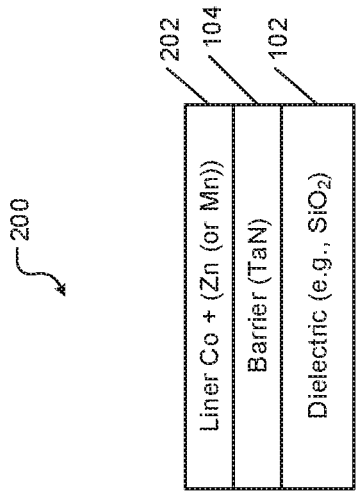
Figure 2E:
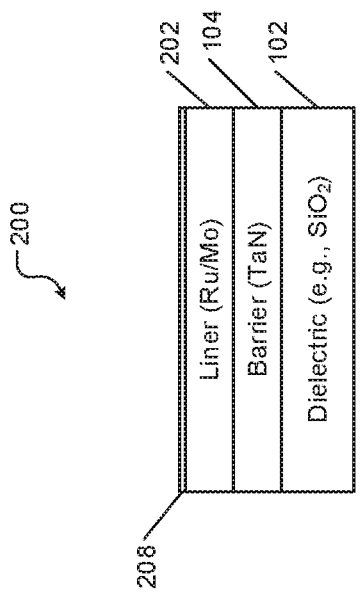

FIGS. 2E and 2F show two different doping methods that can be used to deposit the liner layer 202 including the dopant element Zn (or Mn, In, Sn, or Al) on the barrier layer 104. In FIG. 2E, when Ru (or Mo) is used to form the liner layer 202, first an un-doped liner layer 202 of Ru (or Mo) is deposited on the barrier layer 104, and then a thin layer of the dopant element Zn (or Mn, In, Sn, or Al) 208 is deposited on the un-doped liner layer 202 of Ru (or Mo).

In FIG. 2F, alternatively, when Co is used to form the liner layer 202, the liner layer 202 is formed by co-depositing Co and the dopant element Zn (or Mn, In, Sn, or Al) on the barrier layer 104. The co-deposition method can also be employed when Ru (or Mo) is used to form the liner layer 202. That is, when Ru (or Mo) is used to form the liner layer 202, the liner layer 202 may be formed by co-depositing Ru (or Mo) and the dopant element Zn (or Mn, In, Sn, or Al) on the barrier layer 104.

The term co-depositing denotes depositing two elements together or depositing a mixture of two elements (e.g., Co and Zn). Due to co-deposition, the concentration of the dopant (i.e., the doping level) can be controlled (e.g., maintained) throughout the liner layer 202. Since Co has a higher affinity for oxygen than Ru (and Mo), the concentration of the dopant (i.e., the doping level) in the liner layer 202 may be greater when Co is used than when Ru or Mo is used to form the liner layer 202.

FIGS. 3A-3F show a second example of a structure or a component electroplated using the doping scheme of the present disclosure. In the second example, the component does not include the barrier layer 104.

Figure 3B:
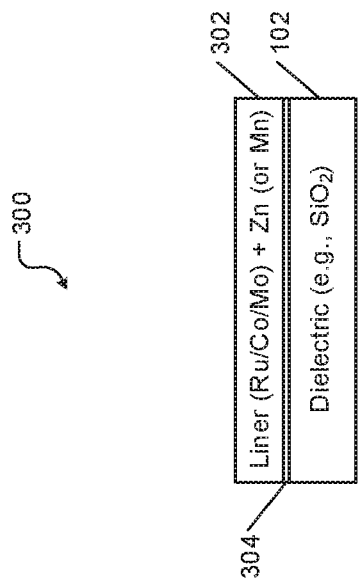
Figure 3A:
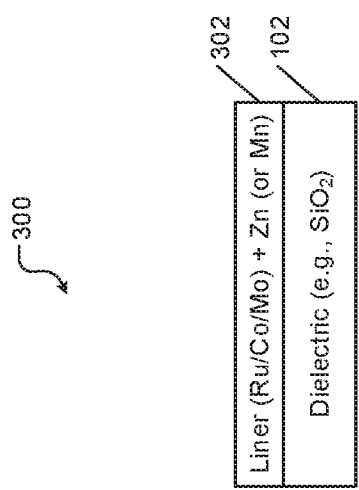

In FIG. 3A, a component 300 to be electroplated comprises the dielectric layer 102 and a liner layer 302. The dielectric layer 102 includes a substrate comprising a low-k dielectric material (e.g., $SiO_2$ substrate). The liner layer 302 includes a layer of Ru, Co, or Mo doped with Zn (or Mn, In, Sn, or Al).

The liner layer 302 is deposited on the dielectric layer 102 using a suitable deposition process (e.g., ALD). The stack of the dielectric layer 102 and the liner layer 202 is then subjected to a suitable thermal treatment (e.g., annealing) to form the component 300.

In FIG. 3B, upon annealing or exposure to room temperature, a thin layer of a compound of Zn (or Mn, In, Sn, or Al) and the dielectric material (e.g., a silicate layer if SiO2 is used as the dielectric layer 102) is formed between the dielectric layer 102 and the liner layer 302. The compound layer is shown at 304. The compound layer 304 prevents oxidation of the liner layer 302 at the interface of the liner layer 302 and the dielectric layer 102. The compound layer 304 also provides adhesion for the liner layer 302 with the dielectric layer 102, which helps during CMP or polishing performed after electroplating.

In FIG. 3C, while the component 300 waits for electroplating and is optionally exposed to air (no vacuum environment is necessary), a thin passivation layer of Zn (or Mn, In, Sn, or Al) oxide (e.g., a passivation or oxide layer 306) is formed on top of the liner layer 302. The oxide layer 306 protects the liner material from further oxidation due to exposure to air.

In FIG. 3D, the metal layer (e.g., Cu) 108 is deposited on the liner layer 302 of the component 300 using electroplating. During electroplating, the oxide layer 306 dissolves in the electrolyte used. The metal layer 108 forms a strong metal-to-metal (Cu—Ru, Cu—Co, or Cu—Mo) bond with the liner layer 302. The compound layer 304 prevents Cu ions from diffusing through the liner layer 302 into the dielectric layer 102.

Figure 3E:
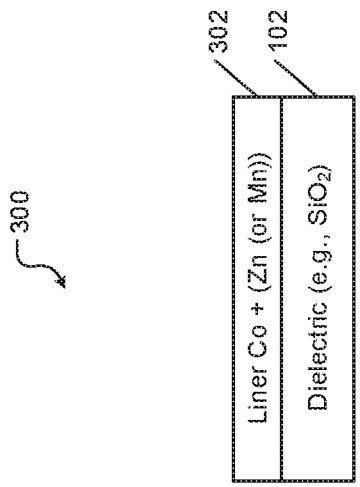
Figure 3E:
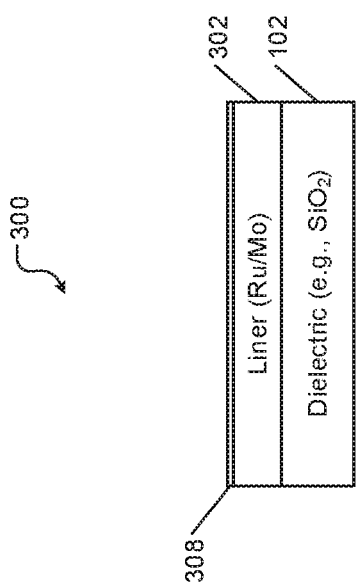

FIGS. 3E and 3F show two different doping methods that can be used to deposit the liner layer 302 including the dopant element Zn (or Mn, In, Sn, or Al) on the dielectric layer 102. In FIG. 3E, when Ru (or Mo) is used to form the liner layer 302, first an un-doped liner layer 302 is deposited on the dielectric layer 102, and then a thin layer of the dopant element Zn (or Mn, In, Sn, or Al) 308 is deposited on the un-doped liner layer 302 of Ru (or Mo).

In FIG. 3F, alternatively, when Co is used to form the liner layer 302, the liner layer 302 is formed by co-depositing Co and the dopant element Zn (or Mn, In, Sn, or Al) on the dielectric layer 102. The co-deposition method can also be employed when Ru (or Mo) is used to form the liner layer 302. That is, when Ru (or Mo) is used to form the liner layer 302, the liner layer 302 may be formed by co-depositing Ru (or Mo) and the dopant element Zn (or Mn, In, Sn, or Al) on the dielectric layer 102.

Due to co-deposition, the concentration of the dopant (i.e., the doping level) can be controlled (e.g., maintained) throughout the liner layer 302. Since Co has a higher affinity for oxygen than Ru (and Mo), the concentration of the dopant (i.e., the doping level) in the liner layer 302 may be greater when Co is used than when Ru or Mo is used to form the liner layer 302.

Figures 4A, 4B:
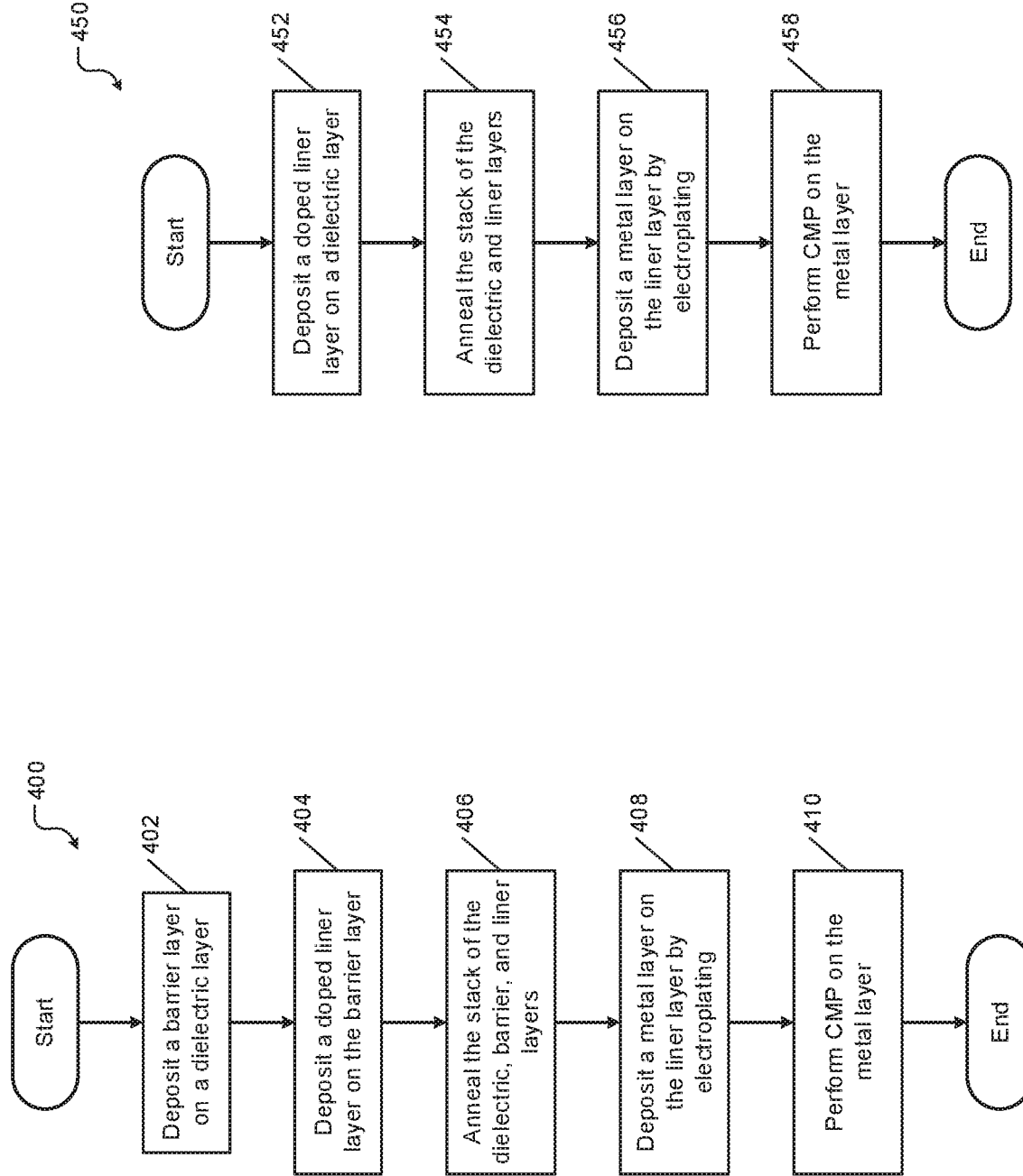
FIG. 4A shows a flowchart of a method for forming the component including a doped liner layer and a barrier layer deposited on a substrate as shown in FIGS. 2A-2F.
FIG. 4B shows a flowchart of a method for forming the component including a doped liner layer and no barrier layer deposited on a substrate as shown in FIGS. 3A-3F.

FIGS. 4A and 4B show methods for forming a component and electroplating the component according to the present disclosure. FIG. 4A shows a first method 400 for forming a component (e.g., component 200 shown in FIGS. 2A-2F) comprising a doped liner layer and a barrier layer. FIG. 4B shows a second method 450 for forming a component (e.g., component 300 shown in FIGS. 3A-3F) comprising a doped liner layer and no explicit barrier layer. A controller (e.g., controllers 510, 680, and 730) shown in FIGS. 5-7 and described below comprises instructions that are stored in a memory and that are executed by a processor of the controller to perform each method.

In FIG. 4A, at 402, the method deposits a barrier layer (e.g., barrier layer 104) on a dielectric layer (e.g., dielectric layer 102) using a suitable deposition method. At 404, the method deposits a doped liner layer (e.g., liner layer 202) on the barrier layer using a suitable deposition method. For example, as described above with reference to FIGS. 2A-2F, the method may form the doped liner layer by first depositing an un-doped liner layer on the barrier layer and then depositing a thin layer of the dopant on top of the un-doped liner layer, or the method may form the doped liner layer by co-depositing the liner material and the dopant on the barrier layer (i.e., by depositing a mixture of the liner material and the dopant on the barrier layer).

At 406, the method subjects the stack of the dielectric layer, the barrier layer, and the doped liner layer to a suitable heat process (e.g., annealing). At 408, the method deposits a metal layer on the doped liner layer by electroplating. At 410, the method performs CMP (polishing) of the metal layer.

In FIG. 4B, at 402, the method deposits a doped liner layer (e.g., liner layer 302) on a dielectric layer (e.g., dielectric layer 102) using a suitable deposition method. For example, as described above with reference to FIGS. 3A-3F, the method may form the doped liner layer by first depositing an un-doped liner layer on the dielectric layer and then depositing a thin layer of the dopant on top of the un-doped liner layer, or the method may form the doped liner layer by co-depositing the liner material and the dopant on the dielectric layer (i.e., by depositing a mixture of the liner material and the dopant on the dielectric layer).

At 454, the method subjects the stack of the dielectric layer and the doped liner layer to a suitable heat process (e.g., annealing). At 456, the method deposits a metal layer on the doped liner layer by electroplating. At 458, the method performs CMP (polishing) of the metal layer.

Figure 5:
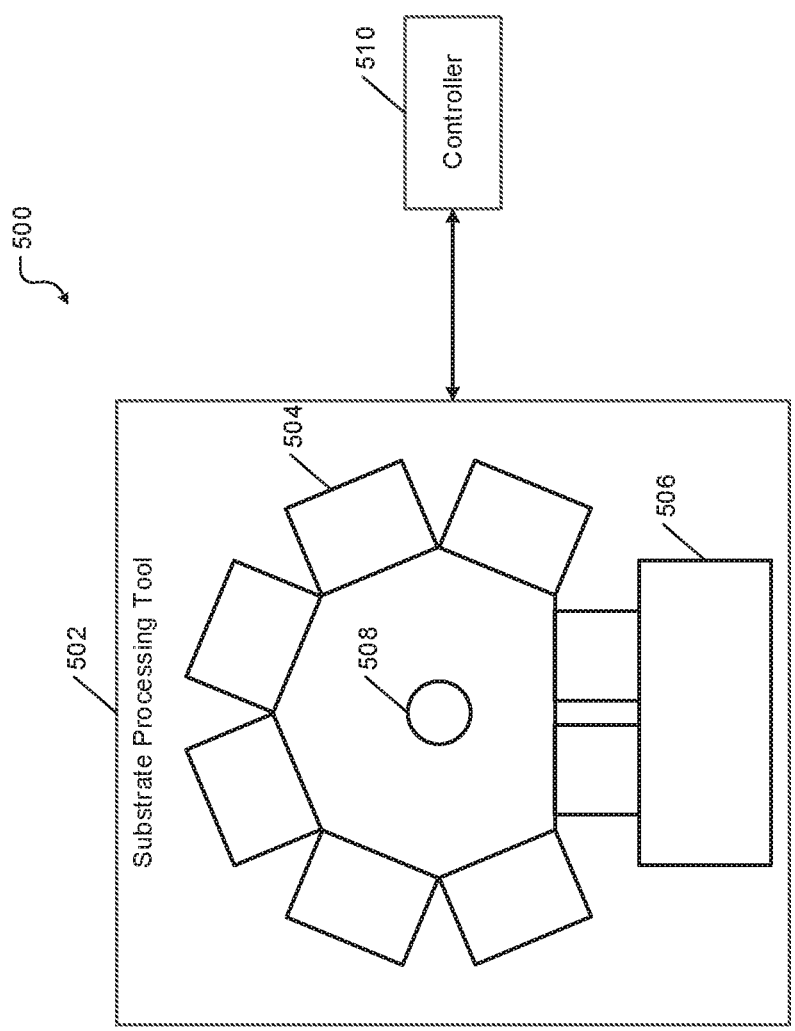
FIG. 5 shows an example of a substrate processing system comprising a plurality of process modules that can be used to deposit the various liner layers and barrier layers on a substrate as shown in FIGS. 2A-3F.

FIG. 5 shows a top-down view of an example of a substrate processing system 500 comprising a plurality of process modules that can be used for depositing the various barrier and liner layers and producing the components 200 and 300 described above with reference to FIGS. 2A-4B. An example of a processing module or chamber used in the substrate processing system 500 to deposit the various barrier and liner layers is described with reference to FIG. 6. An example of a system and apparatus for electroplating the components 200 and 300 is described with reference to FIG. 7.

In FIG. 5, the substrate processing system 500 includes a substrate processing tool 502 and a controller 510. The substrate processing tool (hereinafter tool) 502 includes a plurality of process modules 504. For example, each of the process modules 504 may be configured to perform one or more respective processes on a substrate (e.g., deposit barrier and/or liner layer on the dielectric layer 102). Substrates to be processed (e.g., dielectric layer 102) are loaded into the substrate process tool 502 via ports of a loading station of an equipment front end module (EFEM) 506. A robot 508 transfers the substrates into one or more of the process modules 504 in a sequence in which the substrates are to be processed by the process modules 504. The controller 510 controls the substrate processing tool 502 as described above with reference to FIGS. 4A and 4B. The controller 510 can include a server or any other suitable computing device that can perform the described functionality.

Figure 6:
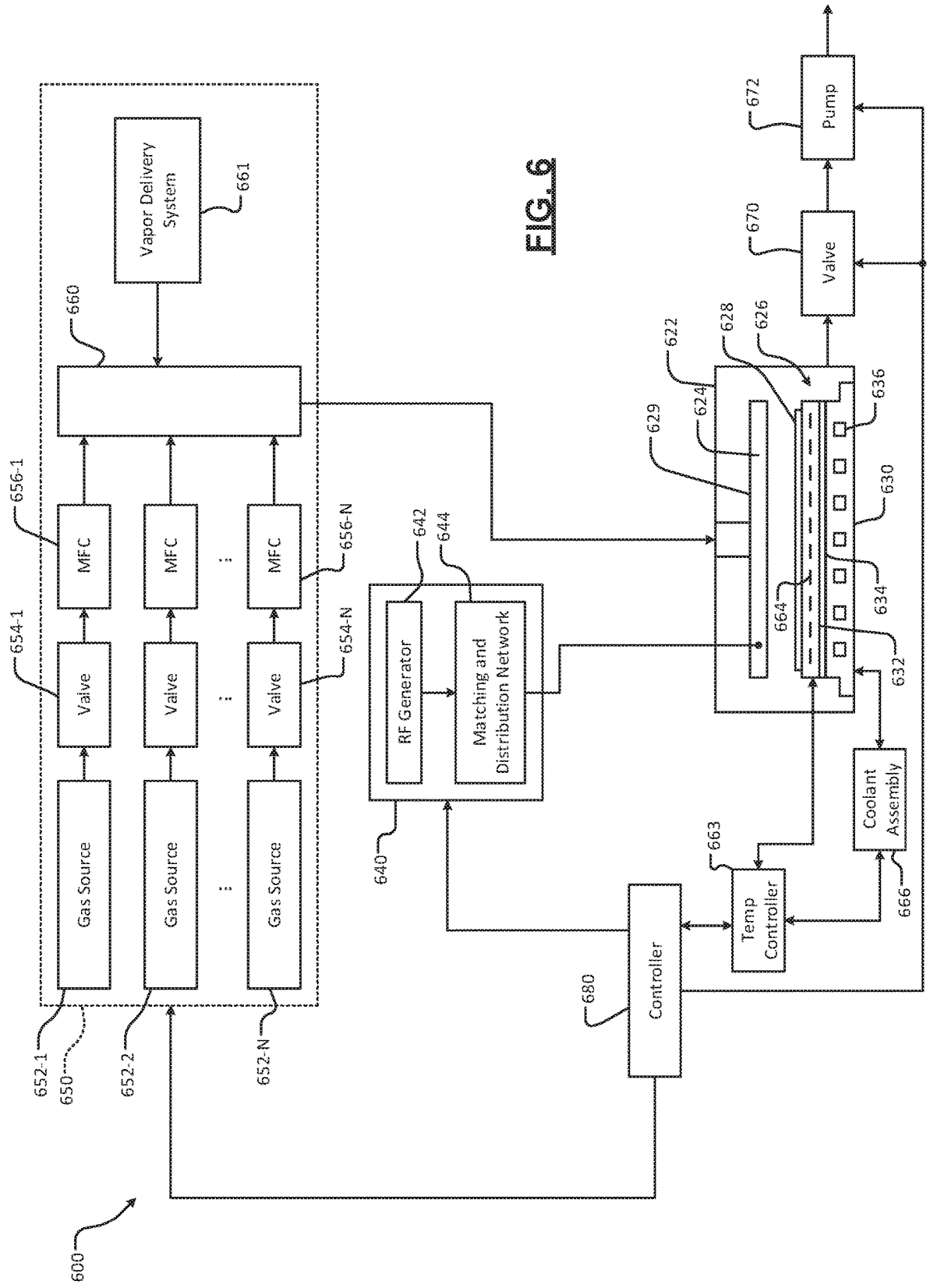
FIG. 6 shows an example of a deposition chamber of the substrate processing system of FIG. 5 that can be used to deposit the various liner layers and barrier layers on a substrate as shown in FIGS. 2A-3F.

FIG. 6 shows a system 600 an example of the process module 504 that can be used to deposit one or more of the barrier and liner layers on a substrate (e.g., dielectric layer 102) described above with reference to FIGS. 2A-4B. While the foregoing example is described in the context of plasma enhanced chemical vapor deposition (PECVD), the teachings of the present disclosure can be applied to other substrate processing systems such as atomic layer deposition (ALD), PEALD, CVD, or any other process.

The system 600 includes a processing chamber 622 that encloses other components of the system 600 and contains RF plasma (if used). The system 600 includes an upper electrode 624 and a substrate support assembly such as an electrostatic chuck (ESC) 626 or other substrate support. During operation, a substrate 628 (e.g., dielectric layer 102) is arranged on the ESC 626.

For example, the upper electrode 624 may include a gas distribution device 629 such as a showerhead that introduces and distributes process gases. The gas distribution device 629 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which vaporized precursor, process gas, or purge gas flows. Alternately, the upper electrode 624 may include a conducting plate, and the process gases may be introduced in another manner.

The ESC 626 includes a baseplate 630 that acts as a lower electrode. The baseplate 630 supports a heating plate 632, which may correspond to a ceramic multi-zone heating plate. A thermal resistance layer 634 may be arranged between the heating plate 632 and the baseplate 630. The baseplate 630 may include one or more channels 636 for flowing coolant through the baseplate 630.

If plasma is used, an RF generating system 640 generates and outputs an RF voltage to one of the upper electrode 624 and the lower electrode (e.g., the baseplate 630 of the ESC 626). The other one of the upper electrode 624 and the baseplate 630 may be DC grounded, AC grounded, or floating. For example only, the RF generating system 640 may include an RF generator 642 that generates RF power that is fed by a matching and distribution network 644 to the upper electrode 624 or the baseplate 630. In other examples, the plasma may be generated inductively or remotely.

A gas delivery system 650 includes one or more gas sources 652-1, 652-2, . . . , and 652-N (collectively gas sources 652), where N is an integer greater than zero. The gas sources 652 are connected by valves 654-1, 654-2, . . . , and 654-N (collectively valves 654) and mass flow controllers 656-1, 656-2, . . . , and 656-N (collectively mass flow controllers 656) to a manifold 660. A vapor delivery system 661 supplies vaporized precursor to the manifold 660 or another manifold (not shown) that is connected to the processing chamber 622. An output of the manifold 660 is fed to the processing chamber 622.

A temperature controller 663 may be connected to a plurality of thermal control elements (TCEs) 664 arranged in the heating plate 632. The temperature controller 663 may be used to control the plurality of TCEs 664 to control a temperature of the ESC 626 and the substrate 628. The temperature controller 663 may communicate with a coolant assembly 666 to control coolant flow through the channels 636. For example, the coolant assembly 666 may include a coolant pump, a reservoir, and one or more temperature sensors. The temperature controller 663 operates the coolant assembly 66 to selectively flow the coolant through the channels 636 to cool the ESC 626. A valve 670 and pump 672 may be used to evacuate reactants from the processing chamber 622. A system controller 680 may be used to control components of the system 600.

Figure 7:
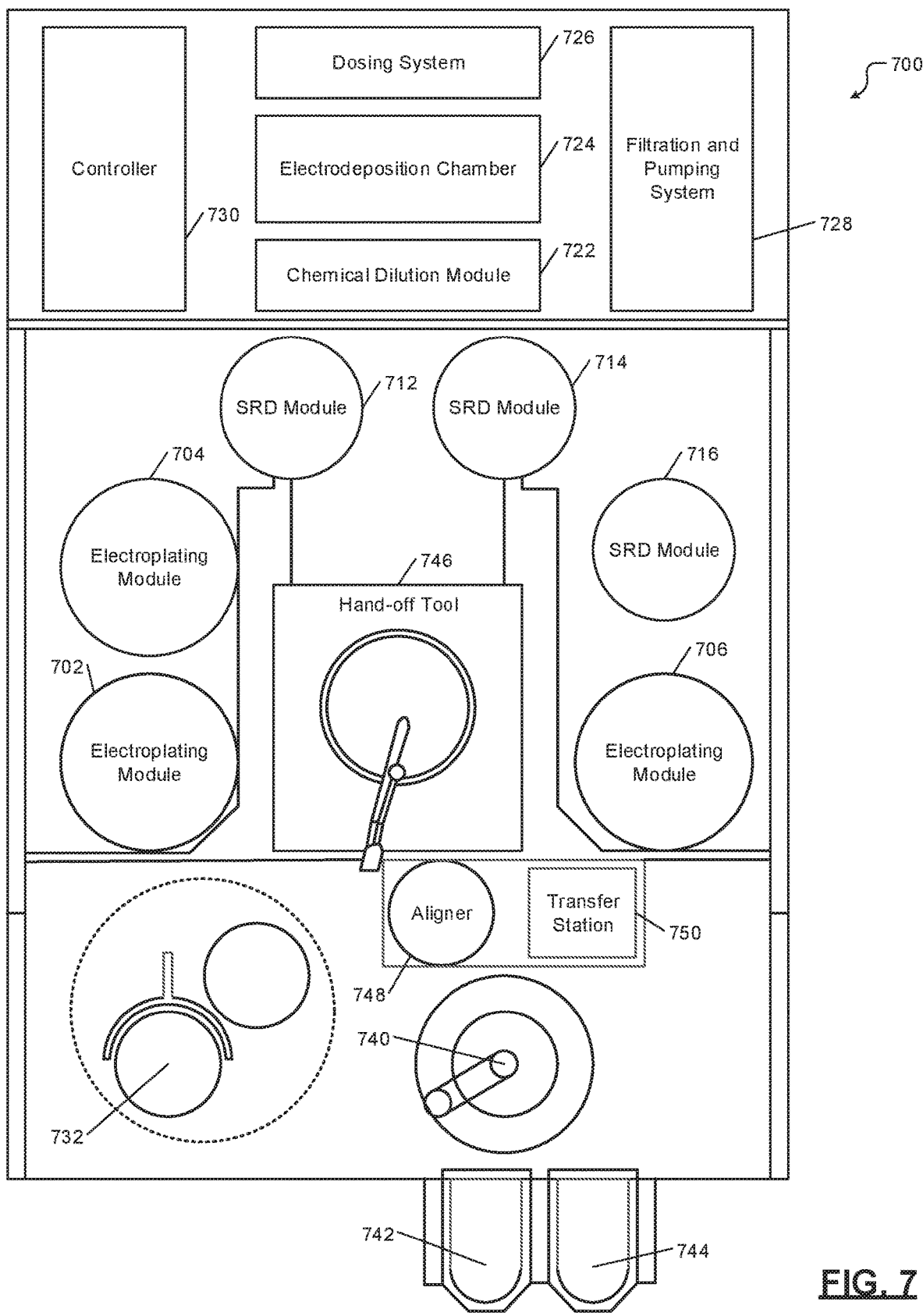
FIG. 7 shows an example of an electroplating system that can be used to electroplate a metal layer on the various components shown in FIGS. 2A-3F.

FIG. 7 shows a schematic of a top view of an example of an electrodeposition apparatus 700 that can be used for depositing the metal layer (Cu) on the components 200 and 300, which are produced by the substrate processing system 500, as described above with reference to FIGS. 2A-4B. The electrodeposition apparatus 700 can include one or more electroplating modules (EPMs) 702, 704, and 706. The electrodeposition apparatus 700 can also include one or more modules 712, 714, and 716 configured for various process operations. For example, in some embodiments, one or more of the modules 712, 714, and 716 may be a spin rinse drying (SRD) module. In other embodiments, one or more of the modules 712, 714, and 1016 may be post-electrofill modules (PEMs). Each of the modules 712, 714, and 716 may be configured to perform a function such as edge bevel removal, backside etching, and acid cleaning of substrates after the substrates are processed by one of the electroplating modules 702, 704, and 706.

The electrodeposition apparatus 700 includes a central electrodeposition chamber 724 that holds the chemical solution used as the electroplating solution in the electroplating modules 702, 704, and 706. The electrodeposition apparatus 700 also includes a dosing system 726 that may store and deliver additives for the electroplating solution. A chemical dilution module 722 may store and mix chemicals to be used as an etchant. A filtration and pumping system 728 may filter the electroplating solution for the central electrodeposition chamber 724 and pump the filtered electroplating solution to the electroplating modules 702, 704, and 706. A system controller 730 provides various interfaces and controls to operate the electrodeposition apparatus 700 and controls the operations of the electroplating apparatus 700 as described below.

Signals for monitoring the processes performed by the various modules of the electrodeposition apparatus 700 may be provided by analog and/or digital inputs of the system controller 730 from various sensors (not shown) installed throughout the electrodeposition apparatus 700. The signals for controlling the processes may be output on analog and digital outputs of the system controller 730. Non-limiting examples of the sensors include mass flow sensors, pressure sensors (e.g., manometers), temperature sensors (e.g., thermocouples), optical position sensors, etc.

A hand-off tool 740 may select a substrate (e.g., component 200 or 300) from a substrate cassette such as a cassette 742 or a cassette 744. The cassettes 742 or 744 may be front opening unified pods (FOUPs). A FOUP is an enclosure designed to securely hold substrates (e.g., component 200 or 300 received from system 500) and to allow the substrates to be removed for processing or measurement by tools equipped with appropriate loading ports and robotic handling systems. The hand-off tool 740 may hold a substrate using a vacuum attachment or some other attaching mechanism.

The hand-off tool 740 may interface with a wafer handling station 732, the cassettes 742 or 744, a transfer station 750, and/or an aligner 748. From the transfer station 750, a hand-off tool 746 may gain access to a substrate (e.g., component 200 or 300). The transfer station 750 may be a slot or a position from and to which the hand-off tools 740 and 746 may pass substrates without going through the aligner 748. In some embodiments, to ensure that a substrate is properly aligned on the hand-off tool 746 for precision delivery to an electroplating module, the hand-off tool 746 may align the substrate with an aligner 748. The hand-off tool 746 may also deliver a substrate to one of the electroplating modules 702, 704, or 706, or to one of the other modules 712, 714, and 716 configured for various process operations.

An example of a process operation may be as follows: (1) electrodeposit copper or another material onto a substrate (e.g., component 200 or 300) in the electroplating module 1004; (2) rinse and dry the substrate in SRD in the module 1012; and (3) perform edge bevel removal in the module 1014.

In this manner, the systems 500 and 700 can be used to produce the components 200 and 300 as described above with reference to FIGS. 2A-4B. The doped liner protects the components 200 and 300 by providing passivation and adhesion and facilitates their electroplating as described above with reference to FIGS. 2A-4B.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method comprising:
depositing a barrier layer on a dielectric layer; and
depositing a liner layer on the barrier layer, wherein the liner layer is doped with a dopant,
wherein the dopant forms a passivation layer on a surface of the liner layer when the surface is exposed to air,
wherein the passivation layer prevents further oxidation of the liner layer when the liner layer is exposed to air,
wherein the dopant diffuses through the liner layer and reacts with the dielectric layer and forms a layer of a compound between the barrier layer and the dielectric layer, and
wherein the layer of the compound adheres the barrier layer to the dielectric layer.

2. The method of claim 1 wherein the layer of the compound prevents oxidation of the barrier layer and the liner layer due to an oxide present in the dielectric layer.

3. The method of claim 1 wherein the dopant includes a more electronegative element than an element used to form the liner layer.

4. The method of claim 1 wherein the passivation layer includes an oxide of the dopant.

5. The method of claim 1 further comprising depositing the dopant on the liner layer.

6. The method of claim 1 further comprising co-depositing the liner layer and the dopant on the barrier layer.

7. The method of claim 1 wherein the compound includes a substance formed by a combination of the dopant with a material in the dielectric layer.

8. The method of claim 1 wherein the dielectric layer includes $SiO_2$ and wherein the compound includes a substance formed by a combination of $SiO_2$ and the dopant.

9. The method of claim 1 further comprising depositing a metal layer on the liner layer.

10. The method of claim 9 wherein the passivation layer dissolves during the depositing of the metal layer and wherein the metal layer bonds with the liner layer.

11. The method of claim 9 wherein the barrier layer prevents oxidation of the metal layer due to an oxide present in the dielectric layer.

12. The method of claim 9 further comprising depositing the metal layer on the liner layer by electroplating.

13. The method of claim 9 further comprising performing chemical mechanical planarization on the metal layer.

14. The method of claim 9 wherein the dopant includes a more electronegative element than elements used to form the liner layer and the metal layer.

15. The method of claim 9 further comprising performing a heat treatment on the liner layer, the barrier layer, and the dielectric layer prior to depositing the metal layer on the liner layer.

16. The method of claim 9 further comprising:
forming the barrier layer using TaN;
forming the liner layer using Ru, Co, or Mo;
doping the liner layer using Zn, Mn, In, Sn, or Al; and
forming the metal layer using Cu.

17. A method comprising:
providing a dielectric layer; and
depositing a liner layer on the dielectric layer, wherein the liner layer is doped with a dopant,
wherein the dopant forms a passivation layer on a surface of the liner layer,
wherein the passivation layer prevents further oxidation of the liner layer due to exposure to air, wherein the dopant diffuses through the liner layer and reacts with the dielectric layer and forms a layer of a compound between the liner layer and the dielectric layer, and wherein the layer of the compound adheres the liner layer to the dielectric layer.

18. The method of claim 17 wherein the layer of the compound prevents oxidation of the liner layer due to an oxide present in the dielectric layer.

19. The method of claim 17 wherein the dopant includes a more electronegative element than an element used to form the liner layer.

20. The method of claim 17 wherein the passivation layer includes an oxide of the dopant.

21. The method of claim 17 further comprising depositing the dopant on the liner layer.

22. The method of claim 17 further comprising co-depositing the liner layer and the dopant on the dielectric layer.

23. The method of claim 17 wherein the compound includes a substance formed by a combination of the dopant with a material in the dielectric layer.

24. The method of claim 17 wherein the dielectric layer includes $SiO_2$ and wherein the compound includes a substance formed by a combination of $SiO_2$ and the dopant.

25. The method of claim 17 further comprising depositing a metal layer on the liner layer.

26. The method of claim 25 wherein the passivation layer dissolves during the depositing of the metal layer and wherein the metal layer bonds with the liner layer.

27. The method of claim 25 wherein the layer of the compound prevents oxidation of the metal layer and the liner layer due to an oxide present in the dielectric layer.

28. The method of claim 25 further comprising depositing the metal layer on the liner layer by electroplating.

29. The method of claim 25 further comprising performing chemical mechanical planarization on the metal layer.

30. The method of claim 25 wherein the dopant includes a more electronegative element than elements used to form the liner layer and the metal layer.

31. The method of claim 25 further comprising performing a heat treatment on the liner layer and the dielectric layer prior to depositing the metal layer on the liner layer.

32. The method of claim 25 further comprising:
forming the liner layer using Ru, Co, or Mo;
doping the liner layer using Zn, Mn, In, Sn, or Al; and
forming the metal layer using Cu.

* * * * *